United States Patent [19]
Usui et al.

[11] Patent Number: 4,764,736
[45] Date of Patent: Aug. 16, 1988

[54] AMPLIFIER FOR HIGH FREQUENCY SIGNAL

[75] Inventors: Akira Usui, Takatsuki; Tadashi Yamada; Kazuhiko Kubo, both of Mishima; Hiroyuki Nagai, Ibaraki, all of Japan

[73] Assignee: Matsushita Electric Industrial Co., Ltd., Osaka, Japan

[21] Appl. No.: 878,874

[22] PCT Filed: Sep. 30, 1985

[86] PCT No.: PCT/JP85/00541
§ 371 Date: May 23, 1986
§ 102(e) Date: May 23, 1986

[87] PCT Pub. No.: WO86/02214
PCT Pub. Date: Apr. 10, 1986

[30] Foreign Application Priority Data

Oct. 1, 1984 [JP] Japan .................. 59-205816
Feb. 20, 1985 [JP] Japan .................. 60-32002

[51] Int. Cl.$^4$ ............................... H03F 1/34
[52] U.S. Cl. ....................... 330/294; 330/297; 330/306; 330/311
[58] Field of Search ............ 330/94, 294, 297, 306, 330/307, 311; 358/184

[56] References Cited

U.S. PATENT DOCUMENTS 3,441,865 4/1969 Siwko ..................... 330/294 X
4,507,620 3/1985 Buisson et al. ............. 330/307

FOREIGN PATENT DOCUMENTS 44-24969 10/1969 Japan .
50-118684 9/1975 Japan .
50-152549 12/1975 Japan .
8955 1/1979 Japan ..................... 330/306

*Primary Examiner*—James B. Mullins
*Attorney, Agent, or Firm*—Wenderoth, Lind & Ponack

[57] ABSTRACT

In an amplifier for a high frequency signal used to amplify a signal having a high frequency in a television tuner, a receiver for satellite broadcasting, and the like, at least two stages of dc-coupled grounded-emitter type amplifiers ($Q_1$, $Q_2$) are configured in an integrated circuit, a resistor ($R_{13}$) is connected between an emitter of the grounded-emitter amplifier ($Q_2$) in the second stage and the grounding, a terminal for connecting an external device is disposed to be connected via a bonding wire to the emitter of the grounded-emitter amplifier ($Q_2$) in the second stage, and a filter circuit (11) including an inductance of the bonding wire and developing a low impedance for a particular frequency is disposed between the terminal and the external grounding.

3 Claims, 7 Drawing Sheets

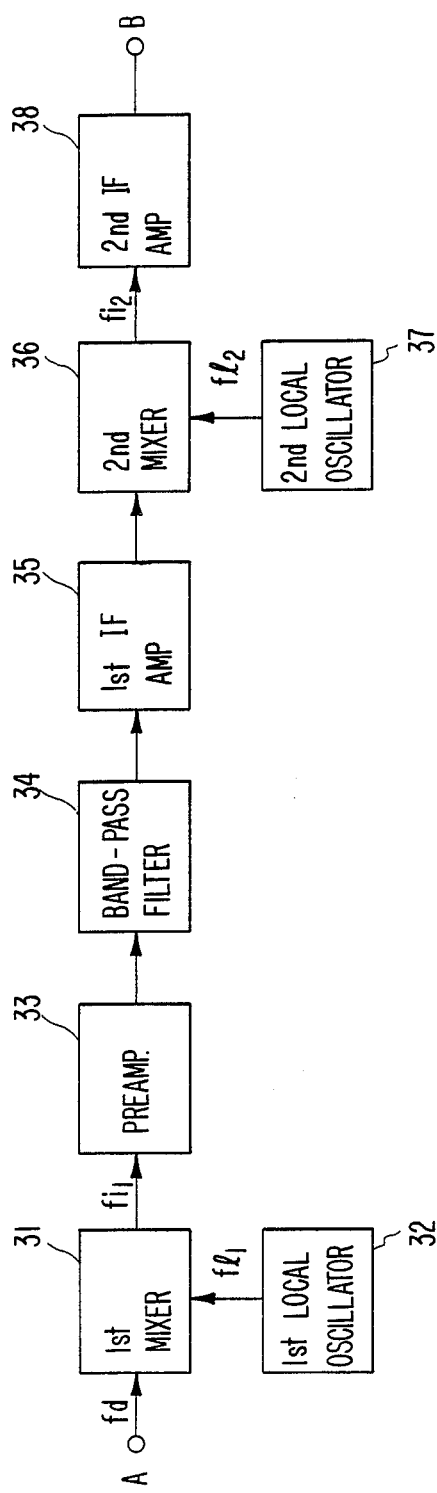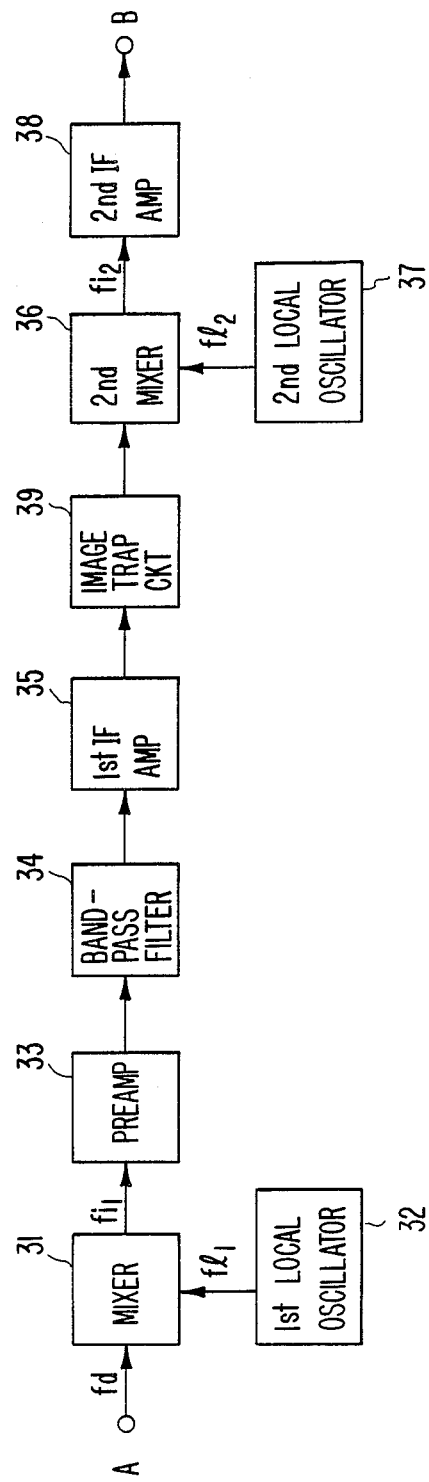

AMPLIFIER FOR HIGH FREQUENCY SIGNAL

TECHNICAL FIELD

The present invention relates to an amplifier for a high frequency signal used to amplify a high frequency signal in a television tuner, a receiver for satellite broadcasing, or the like.

BACKGROUND ART

In the prior art, in order to obtain a high gain in an amplifier circuit for a high frequency signal for processing a high frequency signal of which the frequency is at least in the 100 MHz band, a multistage cascade circuit of the grounded-emitter type amplifier as shown in FIG. 1A has been commonly used. In FIG. 1A, a high frequency signal is supplied from an input terminal IN and is amplified by two stages of transistors $Q_1$ and $Q_2$, and then is delivered from an output terminal OUT. To integrate the circuit of FIG. 1A, the configuration must be sealed in an IC package 1 as shown in FIG. 1B. Since the pins $1a$, $1b$, $1c$, and $1d$ of the IC package 1 are connected to the IC chip by use of bonding wires, the circuit include wire inductances such as $L_{in}$, $L_G$, $L_{out}$, and $L_B$ shown in FIG. 1B. These wire inductances are ordinarily of a value from 2.5 nH to 5 nH, which is ignorable for a lower frequency. For a high frequency signal of which the frequency is at least 800 MHz, the wire inductance cannot be ignored. In the circuit of FIG. 1, the influence of the wire inductances $L_{IN}$, $L_B$, and $L_{out}$ can be removed by use of an external circuit or resistors $R_1$, $R_3$, and $R_4$ in the IC; however, the influence of the inductance $L_G$ inserted between the circuit and a grounding (GND) cannot be eliminated. In the example of this figure, it particularly causes a problem that the common inductance component is inserted for the emitters of the transistors $Q_1$ and $Q_2$, which configures a feedback loop and therefore leads to a serious drawback that the circuit starts oscillation. In FIG. 1C, a resistor $R_5$ is inserted into the emitter of the transistor $Q_2$ of FIG. 1B and the bonding wire inductance $L_{G2}$ is grounded through a bypass capacitor C connected externally with respect to the IC, thereby attempting to improve the oscillation described above. Although any problem may not arise in the case with only the transistor $Q_1$, if the transistors $Q_1$ and $Q_2$ are connected, the emitter of the transistor $Q_1$ is connected to the grounding in the IC, that is, there exists the wire inductance $L_{G1}$ in addition to the wire inductance $L_{G2}$, which makes the grounding potential of the circuit unstable; consequently, even if no problem is caused in the case including only the wire inductance $L_{G1}$, the circuit has a drawback that the oscillation state cannot be prevented in the multistage casecade connection.

DISCLOSURE OF INVENTION

An object of the present invention is to provide in such a multistage cascade integrated circuit system for a high frequency signal an amplifier for a high frequency which is capable of obtaining a stable operation without causing the oscillation phenomenon.

Another object of the present invention is to provide an amplifier for a high frequency signal which can easily achieve an operation to attain a sharp frequency characteristic and a phase shift operation.

Still another object of the present invention is to provide an amplifier for a high frequency signal which is capable of improving the gain without increasing the number of elements and the current consumption.

Another object of the present invention is to provide an amplifier for a high frequency signal which can remove the image disturbance by use of a simple configuration.

The amplifier for a high frequency signal according to the present invention includes an integrated circuit configured by a circuit in which at least two stages of grounded-emitter type amplifiers are connected by use of a direct current coupling, furthermore an emitter resistor is connected between an emitter of the second-stage amplifier and the grounding, at least a terminal of said second-stage amplifier is connected via a bonding wire of the integrated circuit to a terminal disposed externally with respect to the integrated circuit, a filter circuit including the inductance associated with the terminal is configured with respect to the grounding, and a signal having a particular frequency is connected by the filter circuit to a grounding outside the integrated circuit, thereby preventing the feedback due to the emitter resistor so as to increase the gain.

BRIEF DESCRIPTION OF DRAWINGS

FIG. 9 is a block diagram of a converter using an amplifier for a high frequency signal as a first intermediate amplifier, FIG. 10 is a block diagram of a converter solving the drawback of the configuration of FIG. 9.

BEST MODE FOR CARRYING OUT THE INVENTION

Figure 1A:
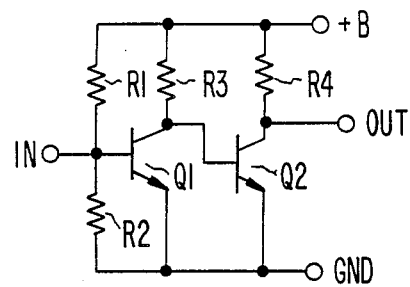
FIGS. 1A, 1B and 1C are circuit diagrams of the conventional amplifier for a high frequency signal.
Figure 1B:
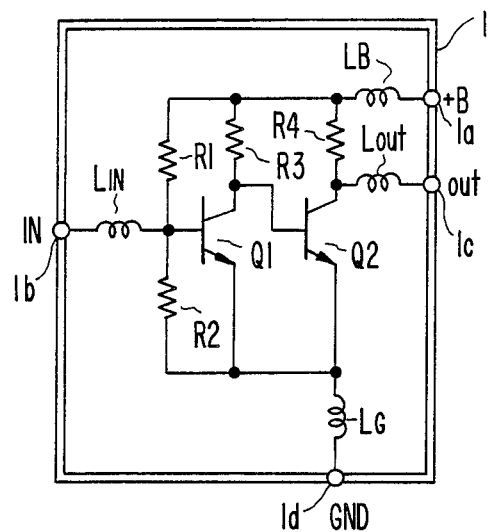
Figure 1C:
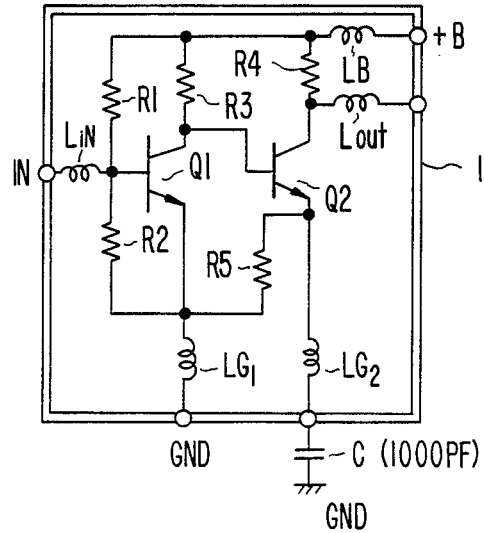
Figure 2:
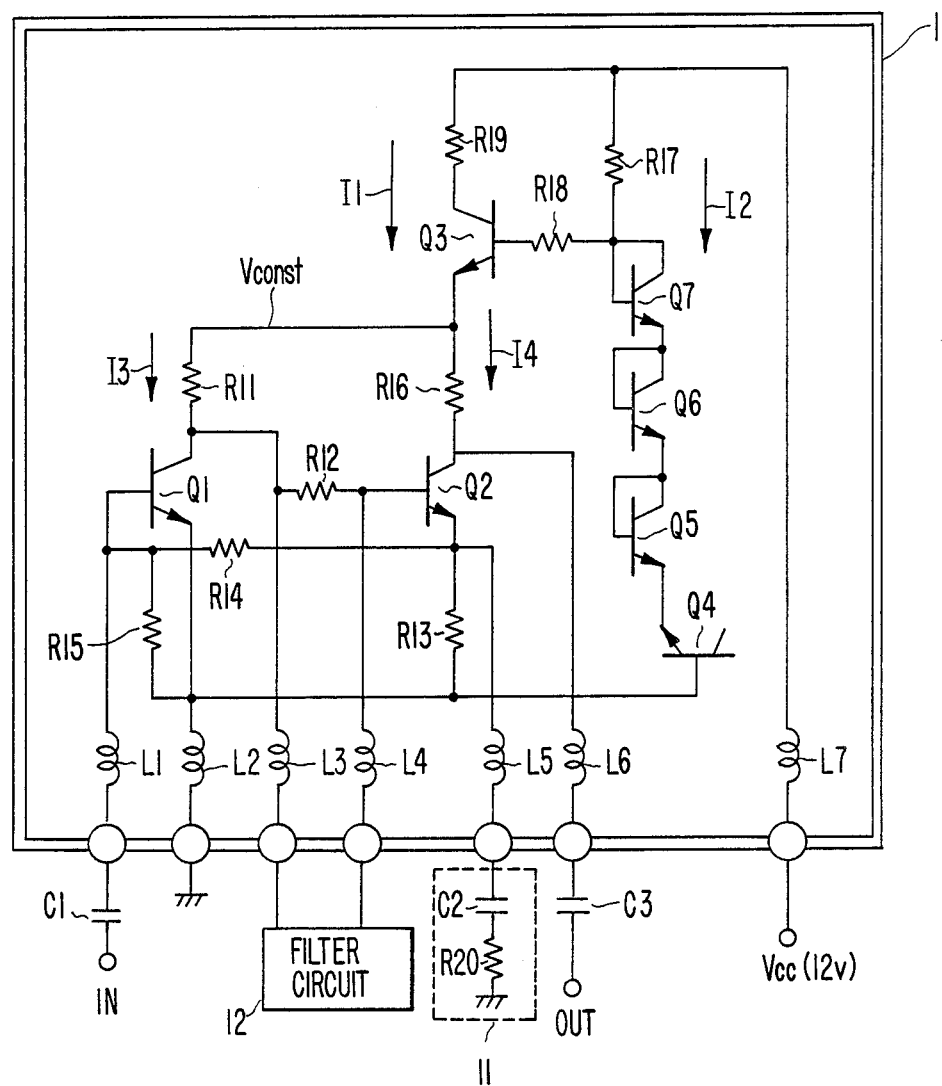
FIG. 2 is a circuit diagram of an amplifier for a high frequency signal according to an embodiment of the present invention.

A description will be given herebelow of an embodiment of the amplifier for a high frequency signal according to the present invention with reference to the accompanying drawings. FIG. 2 shows an embodiment of the present invention. The amplifier for a high frequency signal of this diagram comprises an integrated circuit chip, a package, and bonding wires linking the chip to the package. The IC of this figure is of a 7-pin configuration in which a wire inductance configured by a bonding wire is formed between each pin and a terminal of the package. In this diagram, these inductances are represented as $L_1$–$L_7$ in an equivalent circuit. The wire inductance varies depending on the thickness and length of the wire and is ordinarily of a value from about 2.5 nH to 5 nH. An input signal is supplied from an input terminal IN and is fed via a coupling capacitor $C_1$ to pin ①, and is further delivered via the wire inductance $L_1$ to a base of an amplifying transistor $Q_1$ constituting a grounding-emitter type amplifier in the integrated circuit. The transistor $Q_1$ has an emitter connected to a grounding in the chip, which in turn is connected via the wire inductance $L_2$ to pin ②, which is further connected to an external grounding. The transistor $Q_1$ has a collector connected via a load resistor $R_{11}$ to a regulated voltage $V_{const}$ line in the chip.

A signal amplified by the transistor $Q_1$ is delivered from the collector thereof to pin ③ via the wire inductance $L_3$, and is further supplied via an external filter circuit 12 to pin ④, and is then fed via the wire inductance $L_4$ to a base of an amplifying transistor $Q_2$ constituting a grounded-emitter type amplifier. The collector of the transistor $Q_1$ and the base of the transistor $Q_2$ are connected by a resistor $R_{12}$ having a high resistance (ordinarily 1K$\Omega$ or more) with respect to a direct current (dc). The collector of the transistor $Q_2$ is connected via a load resistor $R_{16}$ to the regulated voltage $V_{const}$ line. The collector of the transistor $Q_2$ is connected via the wire inductance $L_6$ to pin ⑥, and is further led via a coupling capacitor $C_3$ to an external device. The emitter of the transistor $Q_2$ supplies signals to three directions. The first signal path is fed via the wire inductance $L_5$ to pin ⑤, and is then connected via a resonance capacitor $C_2$ and a dumping resistor $R_{20}$ to the external grounding. The second signal path is connected via a resistor $R_{13}$ to the grounding in the chip; moreover, the third signal path is connected so that a divided potential divided by resistors $R_{14}$ and $R_{15}$ is supplied to the base of the transistor $Q_1$, thereby establishing a negative feedback for the transistors $Q_1$ and $Q_2$. The regulated voltage $V_{const}$ in the chip is supplied after being subjected to a current amplification through an emitter follower comprising a transistor $Q_3$ and resistors $R_{19}$ and $R_{18}$. The regulated voltage $V_{const}$ is attained by use of the zener characteristic between the emitter and the base of a transistor $Q_4$. Transistors $Q_5$ to $Q_7$ are used as diodes; consequently, the base of the transistor $Q_3$ is supplied via the resistor $R_{18}$ (about 200 $\Omega$) a potential which is higher than the zener potential of the transistor $Q_4$ by a potential equivalent to three diodes. The power supply voltage $V_{cc}$ (about 12 V) is supplied from pin ⑦ to the resistors $R_{18}$ and $R_{17}$ via the wire inductance $L_7$.

A current flows into the collector of the transistor $Q_1$ through the regulated voltage $V_{const}$ line via the resistor $R_{11}$, and the current branches into the base of the transistor $Q_2$. A current flows into the collector of the transistor $Q_2$ through the regulated voltage $V_{const}$ line via the resistor $R_{12}$. The sum of the base current of the transistor $Q_2$ and the current passing through the resistor $R_{16}$ flows into the emitter of the transistor $Q_2$, and is further fed via the resistor $R_{13}$ to the grounding (GND); consequently, a potential determined by a product of the value of the resistor $R_{13}$ and the emitter current of the transistor $Q_2$ appears accross the resistor $R_{13}$. If this potential is fed back to the base of the transistor $Q_1$ via the resistor $R_{14}$, the base potential of the transistor $Q_1$ increases, the collector potential of the transistor $Q_1$ decreases, and the emitter potential of the transistor $Q_2$ decreases; as a result, the base potential of the transistor $Q_1$ is stabilized at a fixed point, and hence a desired current can be passed through the transistors $Q_1$ and $Q_2$, respectively by appropriately selecting the values of the resistors $R_{11}$, $R_{13}$, $R_{14}$, and $R_{15}$. In such a state, although the input signal is amplified by the transistors $Q_1$ and $Q_2$, the gain cannot be obtained with respect to a high frequency signal because of the emitter resistor $R_{13}$ of the transistor $Q_2$. To overcome this difficulty, a filter circuit 11 is here inserted between the emitter of the transistor $Q_2$ and the grounding so as to decrease the feedback amount of a signal having a specific frequency, thereby stabilizing the circuit operation. The resistor $R_{15}$ in this diagram is inserted to adjust the amount of the direct current to be fed back by use of the resistor $R_{14}$.

As shown in the diagram, when the circuit is integrated and is housed in an IC package, the IC chip and the package are connected by use of bonding wires, which results in the wire inductances $L_1$–$L_7$ as depicted in the figure. These values range from 2.5 nH to 5 nH as described before, and the influence of the wire inductances $L_1$ and $L_6$ can be removed as already noted before; however, the two inductances $L_2$ and $L_5$ each have a strong influence with respect to an alternating current (ac), and each influence respectively causes the circuit to become unstable in its operation, thereby leading to the oscillation state. Consequently, at most only one of the bonding wire inductances $L_2$ and $L_5$ is allowed.

Figure 3:
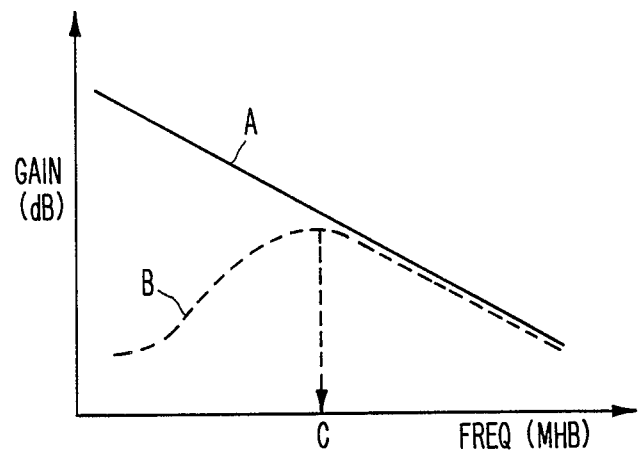
FIG. 3 and FIG. 5 are frequency-amplitude characteristic diagrams of the system of FIG. 2.

In this example, therefore, the wire bonding inductance $L_5$ is removed so as to ensure the stability of the circuit. As shown in the diagram, the filter circuit is disposed outside the IC package so that a resonance occurs due to the filter circuit 11 and the wire inductance $L_5$, thereby establishing a function to absorb the wire inductance component. As the filter circuit 11, a series resonance circuit is constituted with the bonding wire inductance $L_5$ and the capacitor $C_2$ as shown in the figure so as to remove the influence of the wire inductance $L_5$ and further to eliminate the effect of the emitter resistor $R_{13}$ of the transistor $Q_2$ in the neighborhood of the desired frequency. As a result, the characteristic of a broken line B in FIG. 3 is obtained, which enables to suppress the gain in a lower frequency band. In a band from 800 MHz to 1 GHz, the appropriate value of the capacitor $C_2$ is at most 15 pF. If the capacitor $C_2$ develops 1000 pF, the characteristic becomes as shown by the solid line A of FIG. 3, and hence the gain for the lower frequency signal becomes excessive, moreover, due to the effect of the wire inductance $L_5$, the circuit is set to a state in which the oscillation is quite easily started. Under these conditions, the provisions described above are indispensable in the dc-coupled multistage amplifier circuit. In addition, if a dumping resistor $R_{20}$ is inserted for the capacitor $C_2$, an operation for a broad band can be ensured. The filer circuit 11 is not restricted by the configuration shown in the diagram, namely, various resonance circuits, such as those including capacitors and inductances, are available.

The second feature of the circuit shown in FIG. 2 resides in the resistor $R_{12}$ and the filter circuit 12, which will be described herebelow.

Depending on usages of the amplifier for a high frequency signal of FIG. 2, for example, when it is required to obtain a sharp frequency characteristic or when a feedback-type oscillation circuit using a solid-state element filter is to be configured, the phase characteristic of the solid-state element is fixed; consequently, it is required to insert a phase shifter to adjust the frequency. The resistor $R_{12}$ and the filter circuit 12 are disposed to easily attain the sharp frequency characteristic and to facilitate the phase shifting operation.

In FIG. 2, the resistor $R_{12}$ is inserted between the collector of the transistor $Q_1$ and the base of the transistor $Q_2$. In this case, if the dc amplification factor $h_{fe}$ of the transistor $Q_2$ is about 100, the potential drop due to the resistor $R_{12}$ is almost ignorable. Since the resistance of the resistor $R_{12}$ is about 6.8K$\Omega$, the dc component can be passed therethrough without allowin the high-frequency signal to pass. A choke coil may be disposed in place of the resistor $R_{12}$. An intersection of the collector of the transistor $Q_1$ and the resistor $R_{12}$ is connected via the wire inductance $L_3$ to an external terminal ③. On the other hand, an external pin ④ is disposed and is connected via the wire inductance $L_4$ to an intersection of the base of the transistor $Q_2$ and the resistor $R_{12}$; furthermore, the filter circuit is inserted between the external terminals ③ and ④.

Figure 4:
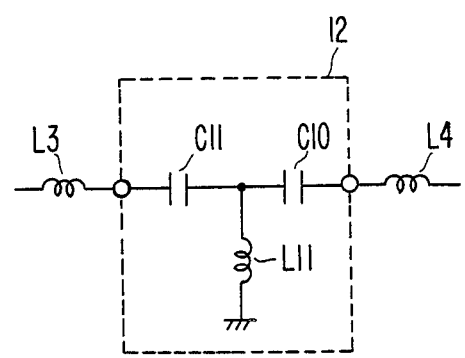
FIG. 4 is a concrete circuit diagram of a filter circuit 12 of FIG. 2.
Figure 5:
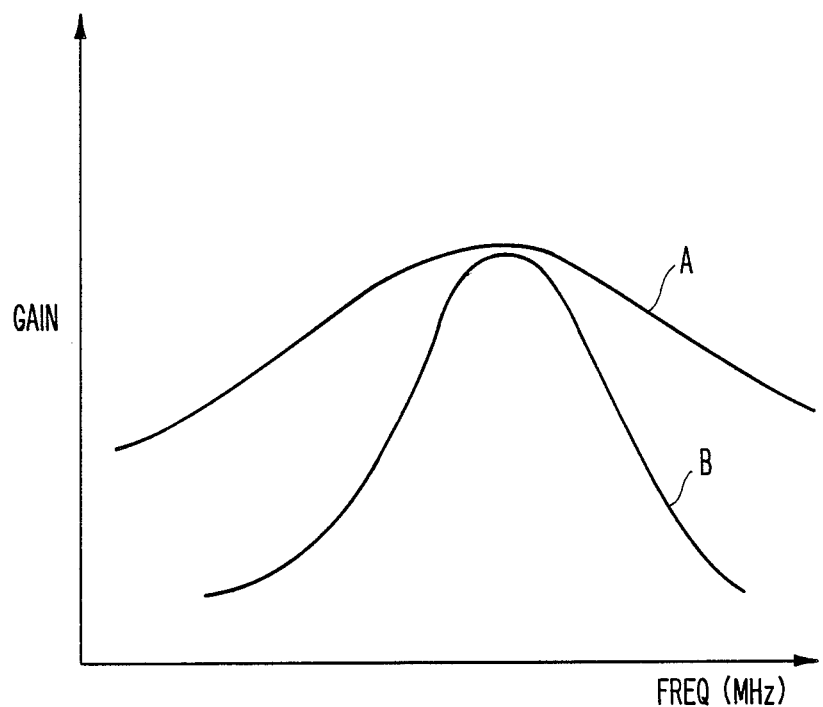

The filter circuit may be configured as shown in FIG. 4. In this diagram, the wire inductances $L_3$ and $L_4$ are absorbed in the capacitors $C_{11}$ and $C_{12}$, and hence the circuit is capacitive in the frequency range below the resonance point. A band-pass filter can be constituted with the capacitor C ($C_{11}$ and $C_{12}$) and the inductance $L_{11}$, and the frequency characteristic thereof is sharp as indicated by the line B in FIG. 5. In addition, the change in the phase characteristic is also sharp in the neighborhood of the peak frequency, and hence the phase characteristic can be varied only by slightly shifting the peak frequency, that is, an effect of a phase shifter can also be developed. This is therefore effective when the circuit of FIG. 2 is used as a feedback-type oscillation circuit using a solid-state element filter. According to the configuration of FIG. 2, a gain from 17 dB to 20 dB is attained for the frequency range from 800 MHz to 1 GHz between the input terminal IN and the output terminal OUT. Moreover, if the gain is to be increased by 10 dB, for example, in the configuration of FIG. 2, such an increase cannot be achieved only by changing the constant of each element of FIG. 2, namely, there exits a problem that the gain cannot be easily improved under restrictions that the chip area (the number of elements) and the current are not increased.

Figure 6:
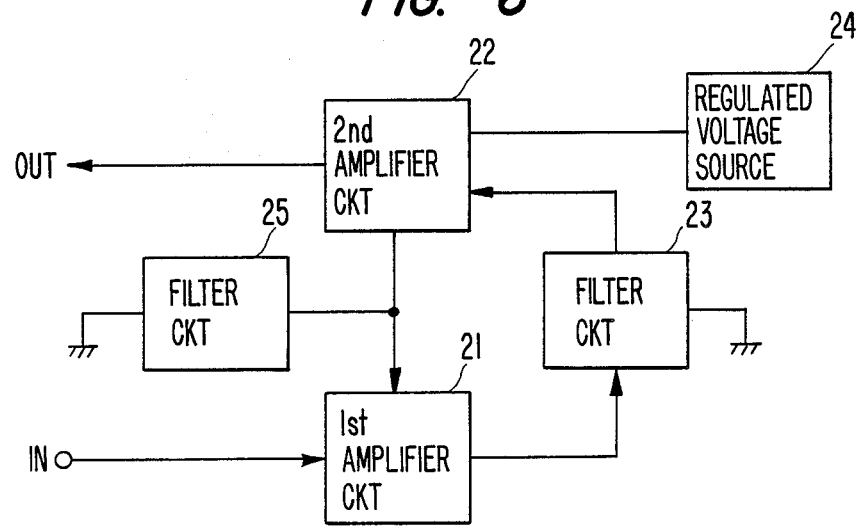
FIG. 6 is a block diagram of an amplifier for a high frequency signal according to another embodiment of the present invention.
Figure 7:
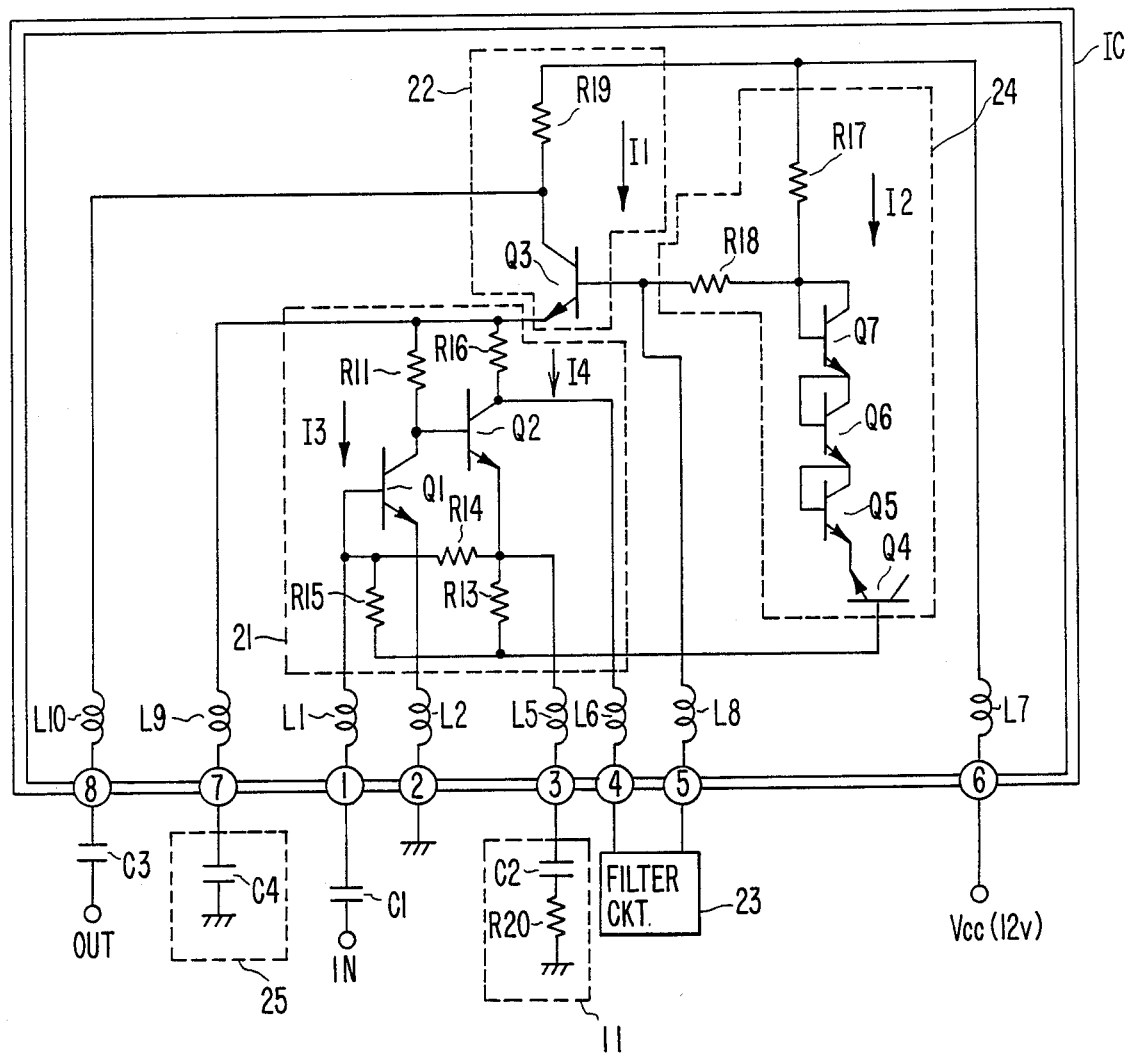
FIG. 7 is a concrete circuit diagram of FIG. 6, FIGS. 8A, 8B are concrete circuit diagrams of a filter circuit 25 of FIG. 7.

FIGS. 6–7 show an amplifier for a high frequency signal which solves the problem. In this diagram, reference numeral 21 is a first amplifying circuit including transistors $Q_1$ and $Q_2$ for amplifying a high-frequency signal inputted from the input terminal IN. Reference numeral 22 indicates a second amplifying circuit for amplifying a signal having a desired frequency which is supplied from the output terminal of the first amplifying circuit 21 via a filter circuit 23. In FIG. 2, a transistor $Q_3$ functioning as an emitter follower for the impedance conversion is also used as the second amplifying circuit 22, thereby attaining the necessary gain together with the first amplifying circuit 21. An output signal having a high frequency is delivered from an output terminal of the second amplifying circuit 22. In this case, to prevent a feedback from the emitter of the second amplifying circuit 22 to the first amplifying circuit 21, a filter circuit 25 is connected to the emitter to lower the im impedance of the emitter. Reference numeral 24 is a regulated voltage source which supplies a bias voltage to the second amplifying circuit 22 so that the operation of the circuit is kept stabilized regardless of the change in the source voltage.

FIG. 7 shows a concrete circuit configuration of FIG. 6.

FIG. 7 shows a case where the circuit is configured by use of an 8-pin integrated circuit. The package pins and chip are connected with wire inductances $L_1$, $L_2$, and $L_5$ to $L_{10}$ each formed with a bonding wire having an inductance value from 2.5 nH to 5 nH. An input signal having a high frequency is supplied from the input terminal IN via the coupling capacitor $C_1$ to pin ① and is further fed via the wire inductance $L_1$ to the base of the transistor $Q_1$ constituting the grounded emitter type amplifier. The emitter of the transistor $Q_1$ is connected to the grounding in the chip and further via the wire inductance $L_2$ to pin ②. which is in turn connected to the external grounding. The collector of the transistor $Q_1$ is connected via the load resistor $R_{11}$ to the emitter of the transistor $Q_3$ constituting the regulated voltage source.

The collector of the transistor $Q_1$ is connected to the base of the second transistor $Q_2$ constituting the grounded-emitter type amplifier. The collector of the transistor $Q_2$ is connected via the load resistor $R_{12}$ to the emitter of the transistor $Q_3$. The emitter of the transistor $Q_2$ has three directions. The first signal path is used to apply a divided potential divided by the resistors $R_{14}$ and $R_{15}$ to the base of the transistor $Q_1$, thereby establishing the negative dc feedback. The second signal path of the emitter of the transistor $Q_2$ is connected via the resistor $R_{13}$ to the grounding in the chip. The third signal path of the emitter of the transistor $Q_2$ is connected to the external grounding via the wire inductance $L_5$ as well as the capacitor $C_2$ and the dumping resistor $R_{20}$ for the resonance.

An output signal amplified by the first amplifying circuit 1 is fed from the collector of the transistor $Q_2$ via the wire inductance $L_6$ to pin ④, and is further passed through the external filter circuit 23 for extracting a desired signal and is delivered from pin ⑤ via the wire inductance $L_5$ to the base of the transistor $Q_3$. A fixed voltage is applied via the resistor having a high resistance to the base of the transistor $Q_3$. The collector of the transistor $Q_3$ is connected to the load resistor $R_{19}$ to the power $V_{cc}$ (about +12 V) line. Since the base of the transistor $Q_3$ is fixed to a regulated potential with respect to a direct current, the emitter of the transistor $Q_3$ is fixed to a constant potential with respect to a direct current. The emitter of the tarnsistor $Q_3$ is connected to the load resistors $R_{11}$ and $R_{16}$, and at the same time, is connected via the wire inductance $L_9$ to pin ⑦ and is finally grounded via the filter circuit 25 disposed outside the integrated circuit. This allows the emitter of the transistor $Q_3$ to be set to a low impedance with respect to a desired frequency.

Figure 8A:
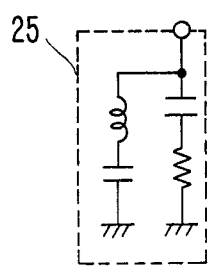
Figure 8B:
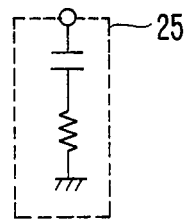

FIGS. 8A, B show another example of the filter circuit 25.

The constant voltage applied to the base of the transistor $Q_3$ is generated by the regulated voltage source 24 comprising the resistor $R_5$ and the transistors $Q_4$–$Q_7$. By use of the zener voltage between the emitter and the base of the transistor $Q_4$, the potential is increased through the three transistors $Q_5$–$Q_7$ each being used as a diode by connecting the collector and the base thereof, and the resultant potential is applied to the base of the transistor $Q_3$. A bias is supplied thereto from the power supply $V_{cc}$ via the resistor $R_{17}$. The regulated potential is applied via the resistor $R_{18}$ having a high resistance to the base of the transistor $Q_3$. The output signal is fed from the collector of the transistor $Q_3$ through the wire inductance $L_{10}$, pin ⑧, and the capacitor $C_3$ disposed to connect an external device.

In the amplifier thus configured, when compared with that of FIG. 2, in place of the sum of the current passing through the transistors $Q_1$ and $Q_2$ of FIG. 2, namely, the total $I_1 = I_3 + I_4$, the total of the current $I_3$ and $I_4$ flowing through the transistors $Q_1$ and $Q_2$, respectively of FIG. 7 can be set to a value at most the total $I_3 + I_4$ of FIG. 2. In this case, since the current $I_3+I_4 \div I_1$ flows through the transistor $Q_3$, it is quite easy to attain a gain at least 10 dB by this transistor $Q_3$; consequently, a sufficient gain can be obtained together with the gain of the first amplifier 1.

In the circuit configured as described above, when compared with the configuration of FIG. 2, the increase of the gain and the improvement of the distortion characteristic due to the increase of the current passing through the third transistor $Q_3$ can be accomplished without increasing the current and the number of elements.

FIG. 9 is a circuit configuration in a case where the amplifier for a high-frequency signal is used as a first intermediate-frequency amplifier of a converter for CATV. In FIG. 9, a signal inputted from a terminal A is mixed with a signal from a first local oscillator 32 in a first mixer 31 and is subjected to a frequency conversion so as to be converted into a first intermediate-frequency signal (to be referred to as a first IF signal herebelow), for example, a signal in the frequency band from 800 MHz to 1 GHz. The first IF signal is connected to a preamplifier 2, however, if a filter in the next stage develops a reduced loss, the preamplifier 2 is omitted. Reference numeral 34 is a band-pass filter which attenuates a signal having a frequency other than that of the first IF signal. The first IF signal is amplified by a first IF amplifier 35. The circuit of FIG. 2 or 7 may be used as the first IF amplifier. The amplified signal is mixed with a signal from the second local oscillator 37 in the second mixer 36 so as to be converted into a second intermediate-frequency signal (to be referred to as a second IF signal herebelow). In a case of a converter, the signal is converted into a signal having a frequency of a channel and is amplified by the second amplifier 6 to be outputted to the terminal B.

However, in a tuner of a converter of the up-down system using such two local oscillators, although an advantage is developed that the image disturbance can be prevented by increasing the first intermediate-frequency so as to set the image frequency to a frequency band outside those of the broadcasing signal, if the outband attenuation factor of the band-pass filter 3 is not satisfactory, the image disturbance occurs for the following frequencies.

That is, assuming

First intermediate frequency ... $f_{i1}$
Second intermediate frequency ... $f_{i2}$
Input signal frequency ... $f_d$
First local oscillator frequency ... $f_{l1}$
Second local oscillator frequency ... $f_{l2}$ then, since $f_{l1}=f_d+f_{i1}$ and $f_{l2}-f_{i2}$ hold, $f_{l1}-f_d=f_{i1}$ is obtained in the first mixer 31 in the normal operation, while $f_{l1}-f_{l2}=f_{i2}$ results from the second mixer 36, thereby obtaining the input signal $f_{i2}$. Under these conditions, when the image signal, namely, $f_d+2f_{i2}$ is inputted, $$f_{l1}-(f_d+2f_{i2})=(f_{l1}+f_d)-(f_d+2f_{i2})=f_{i1}-2f_{i2}$$

is obtained in the first mixer 31, and when this signal is supplied to the second mixer 36, $$f_{l2}-(f_{i1}-2f_{i2})=(f_{l1}-f_{l2})-(f_{i1}-2f_{i2})=f_{i2}$$

is resulted, that is, the signal having the image frequency also appears as $f_{i2}$ in the output, which leads to a problem that the image disturbance also occurs.

The circuit shown in FIG. 10 solves this problem. In this circuit, a trap circuit is inserted between the second IF amplifier and the second mixer to prevent the image disturbance. In FIG. 10, reference numeral 39 is the image trap circuit inserted between the first IF amplifier 35 and the second mixer 36. This image trap circuit 39 is disposed to remove the signal having the frequency equal to $f_{i1}-2f_{i2}$.

Figure 11:
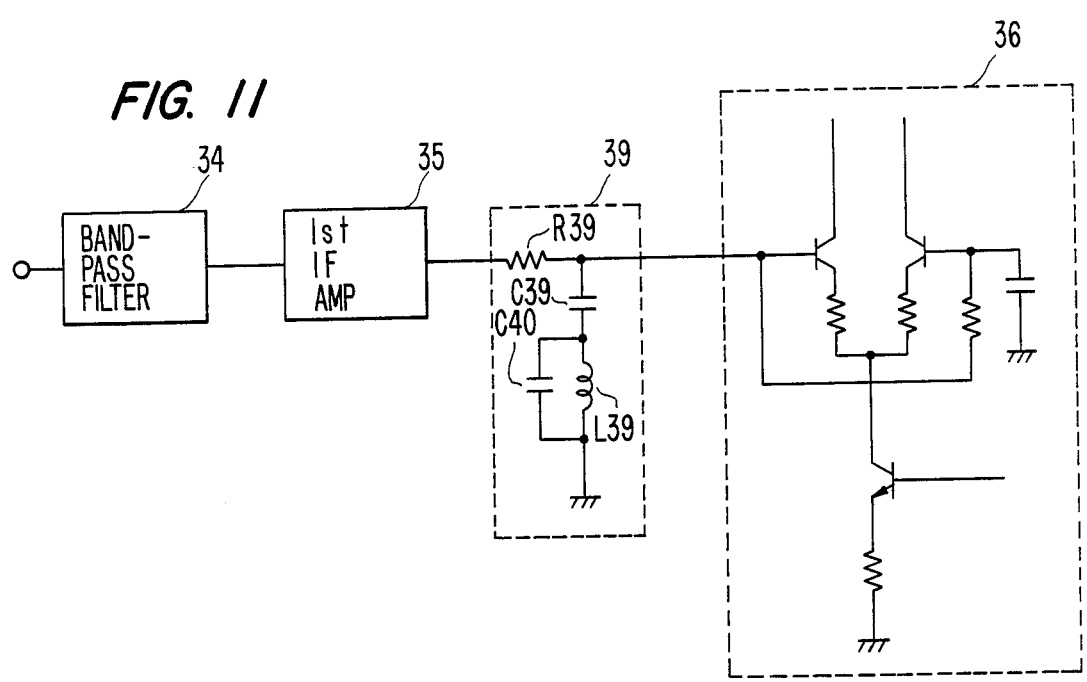
FIG. 11 is a concrete circuit diagram of the primary section of FIG. 10.
Figure 13:
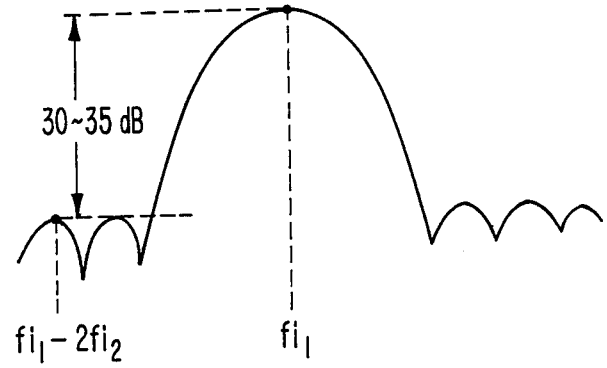
FIG. 13 is a characteristic diagram of a band-pass filter using a surface wave filter.

FIG. 11 shows a further concrete circuit configuration. In FIG. 11, reference numeral 34 is a band-pass filter using an acoustic surface wave device and developing the characteristic of FIG. 13; $R_{39}$, $C_{39}$, and $L_{39}$ constitute the image trap circuit 39, $R_{39}$ indicates a resistor, $C_{39}$ and $C_{40}$ are cpacitors, and $L_{39}$ indicates an inductance. This trap circuit 39 is connected to the second mixer 36 of the differential type in the next stage.

Figure 12:
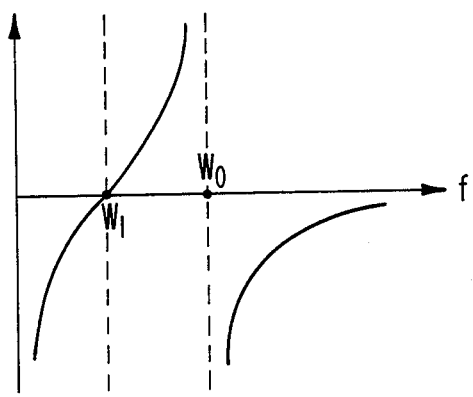
FIG. 12 is a characteristic diagram of a trap circuit of FIG. 11.

Assuming the capacitance of the capacitor $C_{39}$, capacitance of the capacitor $C_{40}$, and the inductance value of the inductance $L_{39}$ to be $C_{39}$, $C_{40}$, and $L_{39}$, respectively, the series resonance point and the parallel resonance point are expressed as $$\omega_1 = \frac{1}{\sqrt{L_{39}(C_{40}+C_{39})}}$$

and $$\omega_0 = \frac{1}{\sqrt{L_{39}C_{40}}}$$

that is, the trap characteristic of FIG. 12 is developed. Setting $\omega_1=2\pi(f_{i1}-2f_{i2})$ and $\omega_0=f_{i1}$, then the series resonance trap is formed with respect to the image frequency, while the parallel resonance is established with respect to the first intermediate frequency $f_{i1}$, that is, the first intermediate frequency $f_{i1}$ can pass through the signal line.

Figure 14A:
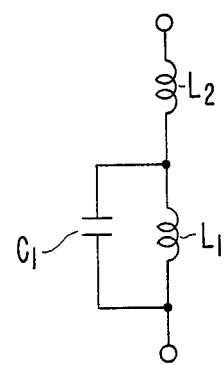
FIGS. 14A, 14B are a circuit diagram and a characteristic diagram showing another example of the trap circuit.
Figure 14B:
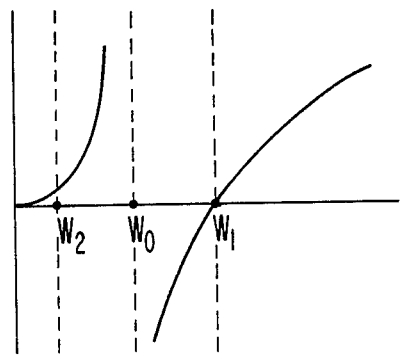

Moreover, if a trap circuit in a configuration shown in FIG. 14a is inserted between the signal line and the grounding and the constants are selected so that the series resonance point $\omega_1=f_{i1}-2f_{i2}$ and the parallel resonance point $\omega_0$ are set between $\omega_2(f_{i2})$ and $\omega_1$, then the trap is formed for the image frequency, and the circuit becomes inductive for a frequency exceeding the image frequency; consequently, the first intermediate frequency $f_{i1}$ passes through the signal line. For a low frequency of the second intermediate frequency $f_{i2}$, although the circuit is inductive, the impedance is low, and hence the signal having the second intermediate frequency $f_{i2}$ is led via the trap circuit to the grounding. As a consequence, for the second mixer 32 connected in the next stage, the image filter for ordinarily attenuating $f_{i2}$ can be configured at the same time. In addition, if the first amplifier 35 and the second mixer 36 are configured in an IC and the mixer input is extracted through an IC pin, a trap can be formed.

Industrial Applicability

According to the present invention as described above, a circuit including at least two stages of dc-coupled grounded-emitter type amplifiers are constructed in an integrated circuit, and an emitter resistor is inserted between the emitter of the second-stage amplifier and the grounding, moreover, the emitter of the second-stage amplifier is connected via a bonding wire to a terminal outside the integrated circuit and a filter circuit indluding the inductance of the bonding wire is formed between the external terminal and the grounding so as to connect a signal having a particular frequency to an external grounding by use of the filter circuit, which prevents the feedback due to the emitter resistor and an unstable state in which the oscillation occurs, namely, this circuit is suitable as an amplifier for a high-frequency signal in a television tuner circuit, a receiver for satellite broadcasting, and the like.

We claim:

1. An amplifier for a high frequency signal in which an integrated circuit including at least two stages of DC coupled ground-emitter type amplifiers is configured, an emitter resistor is connected between an emitter of a grounded-emitter amplifier in a subsequent stage and a ground, a terminal is disposed outside the integrated circuit so as to be connected via a bonding wire to said emitter of the grounded-emitter type amplifier in said subsequent stage, and a first filter circuit including an inductance of the bonding wire and developing a low impedance for a particular frequency is disposed between said terminal and an external ground, said at least two grounded-emitter type amplifiers are supplied with a constant voltage via an emitter-follower transistor, a second filter circuit allowing a particular frequency to pass therethrough is inserted between a collector output of said grounded-emitter type amplifier in said subsequent stage and a base of said emitter-follower transistor, an input signal is amplified by said grounded-emitter type amplifiers and said emitter follower transistor, and the amplified signal is outputted from a collector of said emitter-follower transistor.

2. An amplifier according to claim 1, wherein a third filter circuit developing a low impedance for a particular frequency is inserted between an emitter of said emitter-follower transistor and said external ground.

3. An amplifier according to claim 1, wherein a trap circuit preventing an image disturbance is disposed at an end from which the amplified signal having a high frequency is outputted.

* * * * *